(12) United States Patent
Ma

(10) Patent No.: US 10,965,118 B2
(45) Date of Patent: Mar. 30, 2021

(54) OVER VOLTAGE/ENERGY PROTECTION APPARATUS

(71) Applicant: MEDIATEK INC., Hsin-Chu (TW)

(72) Inventor: Wei-Yu Ma, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 180 days.

(21) Appl. No.: 16/151,355

(22) Filed: Oct. 4, 2018

(65) Prior Publication Data

US 2019/0245341 A1 Aug. 8, 2019

Related U.S. Application Data

(60) Provisional application No. 62/627,273, filed on Feb. 7, 2018.

(51) Int. Cl.
*H02H 7/20* (2006.01)
*H03K 17/082* (2006.01)
*H02H 9/04* (2006.01)

(52) U.S. Cl.
CPC ............. *H02H 7/20* (2013.01); *H02H 9/04* (2013.01); *H02H 9/041* (2013.01); *H02H 9/046* (2013.01); *H03K 17/0822* (2013.01); *H03K 2217/0081* (2013.01)

(58) Field of Classification Search
CPC .. H02H 7/20; H02H 9/04; H02H 3/20; H02H 3/202; H02H 9/046; H02H 7/09; H02H 9/091; H01L 23/60; H01L 27/0248; H03K 17/0822; H03K 17/74
See application file for complete search history.

(56) References Cited

U.S. PATENT DOCUMENTS

| 7,027,276 | B2 | 4/2006 | Chen | |
| 7,567,787 | B2* | 7/2009 | Kuo | G01D 18/008 |
| | | | | 455/217 |
| 8,023,237 | B2* | 9/2011 | Lin | H02H 9/046 |
| | | | | 361/56 |
| 9,214,806 | B1* | 12/2015 | Huang | H01L 27/0266 |
| 2009/0195951 | A1* | 8/2009 | Sorgeloos | H02H 9/046 |
| | | | | 361/56 |
| 2012/0307410 | A1* | 12/2012 | Yamazaki | H01L 21/82384 |
| | | | | 361/88 |

(Continued)

FOREIGN PATENT DOCUMENTS

| CN | 1377088 A | 10/2002 |
| CN | 1979854 A | 6/2007 |

(Continued)

*Primary Examiner* — Gustavo A Rosario-Benitez
(74) *Attorney, Agent, or Firm* — Winston Hsu

(57) ABSTRACT

An EOS/ESD protection apparatus includes a voltage detection circuit, a controlling circuit having a switch unit, an inverter circuit, and a clamp transistor. The voltage detection circuit is configured to detect whether an over voltage event occurs in a power supply line to generate a switch control signal. The switch unit is turned on/off to generate a voltage control signal according to the switch control signal. The inverter circuit has an output and an input coupled to the voltage control signal transmitted from the controlling circuit. The clamp transistor has a control terminal coupled to the output of the inverter and is configured to be turned on when the over voltage event occurs in the power supply line.

10 Claims, 11 Drawing Sheets

(56) References Cited

U.S. PATENT DOCUMENTS

| | | | | |
|---|---|---|---|---|
| 2014/0355157 | A1* | 12/2014 | Huang | H02H 9/046 |
| | | | | 361/56 |
| 2015/0077890 | A1* | 3/2015 | Ozawa | H01L 27/0248 |
| | | | | 361/56 |
| 2015/0162746 | A1* | 6/2015 | Ikeda | H02H 9/046 |
| | | | | 361/56 |
| 2015/0288172 | A1* | 10/2015 | Yeh | H02H 9/046 |
| | | | | 361/56 |
| 2019/0165571 | A1* | 5/2019 | Batra | H01L 27/0288 |

FOREIGN PATENT DOCUMENTS

| | | |
|---|---|---|
| CN | 102693978 A | 9/2012 |
| CN | 104867910 A | 8/2015 |
| TW | 200637096 | 10/2006 |
| TW | 200952300 | 12/2009 |
| TW | 201315075 A1 | 4/2013 |
| TW | 201539917 A | 10/2015 |
| TW | 201728034 A | 8/2017 |

* cited by examiner

OVER VOLTAGE/ENERGY PROTECTION APPARATUS

CROSS REFERENCE TO RELATED APPLICATIONS

This application claims priority of U.S. provisional application Ser. No. 62/627,273 filed on Feb. 7, 2018, which is entirely incorporated herein by reference.

BACKGROUND

Generally speaking, a conventional over energy protection circuit such as ESD (electrostatic discharge) protection circuit may be arranged to perform over energy protection based on an R-C (resistor-capacitor) time constant. The conventional circuit is arranged to employ the R-C time constant to discriminate an abnormal energy event from a normal system power ON/OFF event so that the conventional circuit is not arranged to discharge or leak the energy, caused by the normal system power ON/OFF event, rising in the power supply line. However, actually the conventional circuit cannot perform over energy protection to discharge abnormal energy caused by an unexpected EOS (electrical over stress) event since the unexpected EOS event may not be specified in a general specification and the R-C time constant based solution cannot discriminate the EOS event from the normal system power ON/OFF event. For example, an ESD event may be defined as an event which causes over energy abnormally rising in a shorter time such as shorter than 10 microseconds while an EOS event or the normal system power ON/OFF event may cause over energy rising in a longer time such as longer than 100 microseconds. The only difference between an EOS event and the normal system power ON/OFF event is that the EOS event will cause an over high voltage rising, but the conventional R-C time constant based solution cannot detect such over high voltage rising.

SUMMARY

Therefore one of the objectives of the invention is to provide an over voltage/energy protection apparatus for an EOS event and/or an ESD event, to solve the above-mentioned problems.

According to embodiments of the invention, an over voltage/energy protection apparatus is disclosed. The apparatus comprises a voltage detection circuit, a controlling circuit having a switch unit, an inverter circuit, and a clamp transistor. The voltage detection circuit is configured to detect whether an over voltage event occurs in a power supply line to generate a switch control signal. The switch unit is turned on/off to generate a voltage control signal according to the switch control signal. The inverter circuit has an output and an input coupled to the voltage control signal transmitted from the controlling circuit. The clamp transistor has a control terminal coupled to the output of the inverter and is configured to be turned on when the over voltage event occurs in the power supply line.

According to the embodiments, the apparatus can be arranged to discharge abnormal energy, caused by an ESD event or an EOS event, occurring in a power supply line. For example, the ESD event may indicate an over voltage condition/event currently specified in the ESD specification while the EOS event may indicate an over voltage condition/event not specified or unexpected in the ESD specification; however, this is not meant to be a limitation.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing an ESD (electrostatic discharge) or EOS (electrical over stress) protection apparatus/solution capable of protecting components of an integrated circuit chip from the damage of over voltage/energy or abnormal energy rising in the power supply line VDD. The provided ESD/EOS protection apparatus/solution can fast or rapidly discharge abnormal energy from the power supply line VDD to the ground. In addition, the provided ESD/EOS protection apparatus/solution can correctly discriminate an over voltage event from a normal supply voltage rising caused due to system power ON/OFF.

Figure 1:
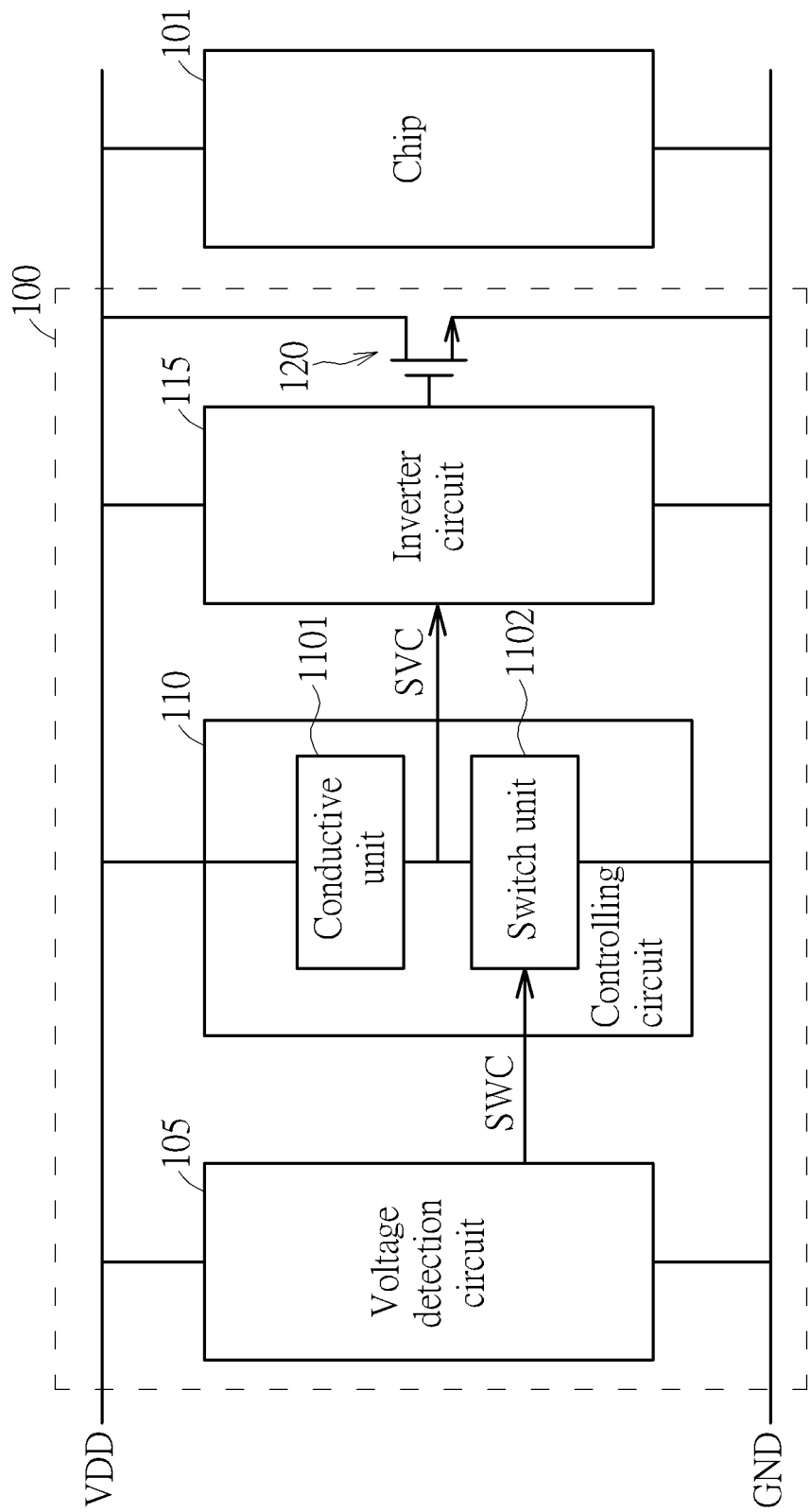
FIG. 1 is a block diagram of an over voltage/energy protection apparatus according to embodiments of the invention.

FIG. 1 is a block diagram of an over voltage/energy protection apparatus 100 according to embodiments of the invention. The apparatus 100 comprises a voltage detection circuit 105, a controlling circuit 110, an inverter circuit 115, and a clamp transistor 120. The apparatus 100 for example is arranged to be installed or configured within an integrated circuit chip 101 to be protected.

The voltage detection circuit 105 is configured to detect whether an over voltage event occurs in a power supply line/signal VDD to generate a switch control signal SWC. The controlling circuit 110 is coupled to the voltage detection circuit 105 and is configured to generate a voltage control signal SVC according to the switch control signal SWC. The controlling circuit 110 comprises a conductive unit/circuit 1101 and a switch unit/circuit 1102. The inverter circuit 115 has an output and an input coupled to the voltage control signal SVC transmitted from the controlling circuit 110. The clamp transistor 120 has a control terminal coupled to the output of the inverter circuit 115 and is configured to be turned on when the over voltage event occurs in the power supply line VDD. The clamp transistor 120 is turned off when no over voltage events occur in the power supply line VDD.

In the embodiments, an over voltage event may mean an ESD event or an EOS event.

The voltage detection circuit 105 is arranged to detect whether an abnormal voltage rising occurs in the power supply line VDD to determine whether an over voltage event occurs or not to generate the switch control signal SWC. The abnormal voltage rising may indicate an instantaneously raised abnormal voltage different from a voltage rising caused by the system power ON/OFF. For example, the occurrence of an over voltage event may be defined by the voltage level of the power supply voltage becoming higher than a specified voltage level which can be configured a user/designer. For example, the specified voltage level may be set as three times of a transistor's threshold voltage Vt, e.g. almost 2.1 Volts if the threshold voltage Vt is almost 0.7 Volts. That is, the voltage detection circuit 105 may determine that an abnormal voltage rising occurs in the power supply line VDD when/if detecting that the voltage level at the power supply line VDD becomes higher than 2.1 Volts.

When detecting that an over voltage event occurs, the voltage detection circuit 105 is arranged to generate the switch control signal SWC to enable or turn on the switch unit 1102 (i.e. control the switch unit 1102 at a closed state) to control the switch unit 1102 become closed/conductive. When the switch unit 1102 becomes closed or conductive, the voltage level of the voltage control signal SVC is dropped to the ground level GND or almost approximated to the ground level GND. The inverter circuit 115 is arranged to output or generate a higher voltage level to the gate of clamp transistor 120 to turn on the clamp transistor 120 so as to discharge the abnormal energy/voltage caused by the over voltage event to protect the chip 101.

Instead, when detecting that no over voltage events occur, the voltage detection circuit 105 is arranged to generate the switch control signal SWC to turn off the switch unit 1102 (i.e. control the switch unit 1102 at an open state) to control the switch unit 1102 be open or non-conductive. When the switch unit 1102 becomes open or non-conductive, the voltage level of the voltage control signal SVC is raised up to the voltage level of the power supply line VDD or almost approximated to the level of power supply line VDD through the conductance of the conductive unit 1101. Based on the voltage control signal SVC is with a higher level, the inverter circuit 115 accordingly is arranged to output or generate a lower voltage level to the gate of clamp transistor 120 to turn off the clamp transistor 120 so as not to discharge energy/voltage at the power supply line VDD.

Figure 2:
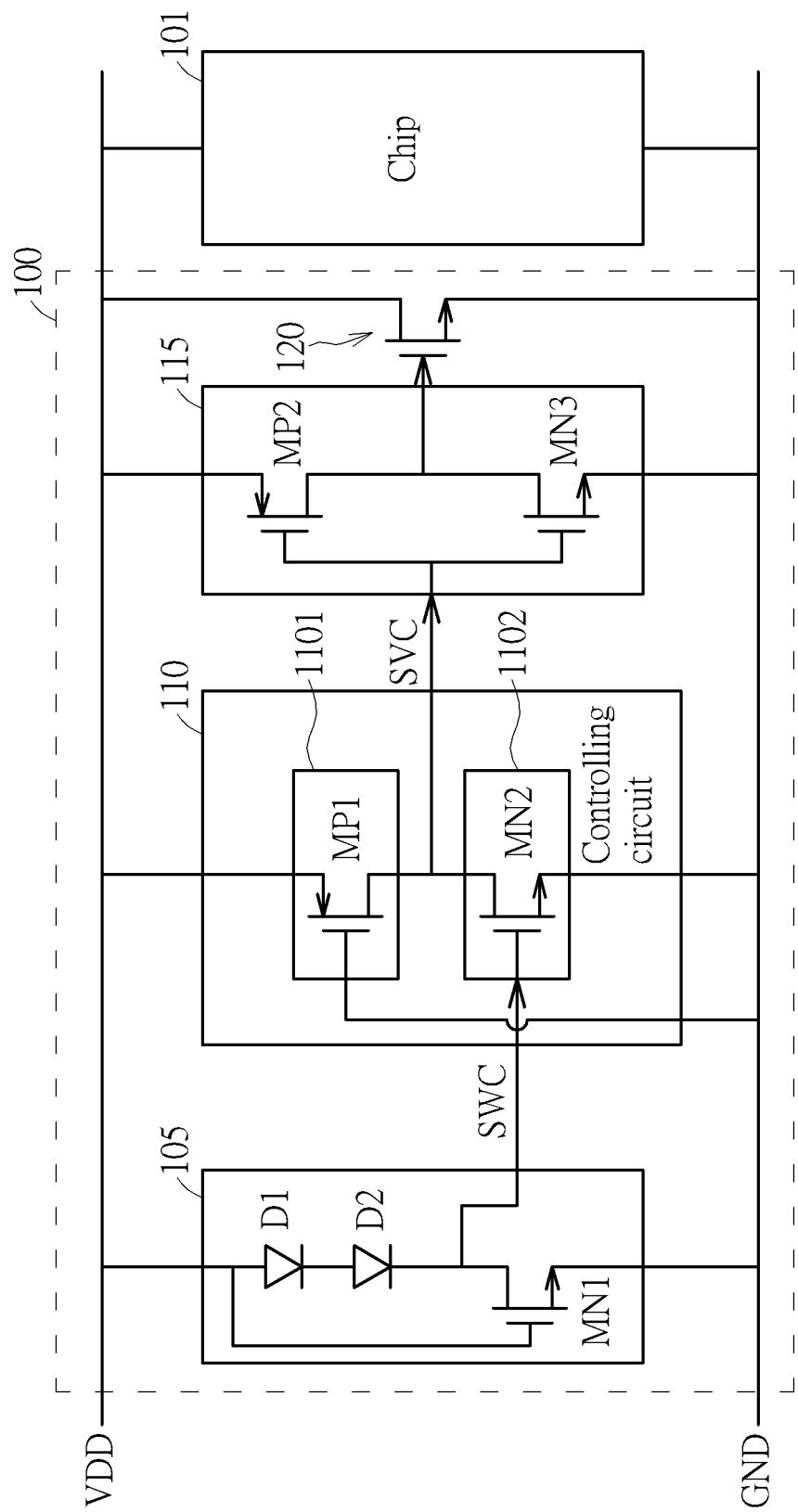
FIG. 2 is a circuit diagram of the over voltage/energy protection apparatus as shown in FIG. 1 according to a first embodiment of the invention.

FIG. 2 is a circuit diagram of the EOS/ESD protection apparatus 100 as shown in FIG. 1 according to a first embodiment of the invention. In this embodiment, the voltage detection circuit 105 for example comprises at least one diode such as two diodes D1 and D2 connected in series and a first transistor such as an NMOS transistor M1. The anode of diode D1 is coupled to the power supply line VDD. The NMOS transistor M1 has a control terminal (e.g. gate) coupled to the power supply line VDD, a first terminal (e.g. drain) coupled to a cathode of the at least one diode (e.g. the cathode of the diode D2), and a second terminal (e.g. source) coupled to the ground level. The switch control signal SWC is generated at the first terminal (i.e. drain) of the transistor MN1, and is transmitted to the controlling circuit 110.

The controlling circuit 110 comprises the conductive unit 1101 and the switch unit 1102 wherein in this embodiment the conductive circuit unit is implemented by and comprises a PMOS transistor MP1 which has a control terminal (i.e. gate) coupled to the ground level GND, a first terminal (i.e. source) coupled to the power supply line VDD, and a second terminal (i.e. drain) coupled to a second transistor MN2. The transistor MP1 is always turned-on if the power supply line VDD is provided since its gate is directly coupled to the ground level GND. Further, the switch unit 1102 for example is implemented by using the NMOS transistor MN2 having a control terminal (i.e. gate) coupled to the switch control signal SWC, a first terminal (e.g. drain) coupled to the drain of PMOS transistor MP1, and a second terminal (e.g. source) coupled to the ground level GND. The switch control signal SWC is arranged to turn on/off the second transistor MN2 to generate the voltage control signal SVC at the first terminal (i.e. drain) of the second transistor MN2. In addition, the inverter circuit 115 in this embodiment for example comprises a PMOS transistor MP2 and an NMOS transistor MN3; however, this is not meant to be limitation.

For the operation, the voltage detection circuit 105 is arranged to generate the switch control signal SWC having a voltage lower than the threshold voltage Vt of the NMOS transistor MN2 when detecting that no over voltage events occur in the power supply line VDD, to control/make the second transistor MN2 be off/non-conductive. Instead, the voltage detection circuit 105 is arranged to generate the switch control signal SWC having a voltage higher than the threshold voltage Vt when detecting that an over voltage event occurs in the power supply line VDD, to control/make the NMOS transistor MN2 be on/conductive by using such higher voltage to turn on the second transistor MN2. That is, the switch control signal SWC generated from the voltage detection circuit 105 is arranged to enable or disable the transistor MN2.

For example, when/if no over voltage events occur in the signal VDD, e.g. the voltage at signal VDD is at 1 Volts (a normal power supply level), the transistor MN1 is turned on since its gate is directly coupled to the power supply line VDD and the voltage drop across its gate and source is higher than the threshold voltage Vt such as 0.7 Volts, and the voltage at the drain of transistor MN1 is almost equal to the ground level GND. In this situation, the diodes D1 and D2 are not forward biased since the voltage drop across the diodes D1 and D2 is not enough. That is, the diodes D1 and D2 are not conducted. The voltage level of the switch control signal SWC, i.e. the level at the gate of transistor MN2, accordingly is almost equal to the ground level GND such as zero Volts lower than the threshold voltage Vt. In this situation, the transistor MN2 is not turned on (or is kept off) by the switch control signal SWC. That is, the switch unit 1102 is off or open. Almost no currents pass through the transistor MP1. Since the transistor MP1 is turned on, the voltage level of the voltage control signal SVC in this situation is raised up and become almost equal to the level of power supply line VDD, i.e. 1 Volts. Thus, the voltage at the input of the inverter circuit 115 is almost equal to 1 Volts, i.e. a high logic level, and transistor MN3 is turned on while the transistor MP2 is turned off. The voltage at the output of the inverter circuit 115 is at a low logic level. The clamp transistor 120 is kept at the off state or turned off. The protection apparatus 100 in this situation is not arranged to discharge abnormal energy from the power supply line VDD to the ground level.

When/if the voltage at signal VDD is at a range from almost 1.4-1.5 Volts to almost 2.1 Volts (e.g. the level of VDD may rise due to the system power ON/OFF), the voltage detection circuit also decides that no over voltage events occur in the signal VDD. In this situation, the transistor MN1 is still turned on, and the diodes D1 and D2 may be forward biased since the voltage drop across the diodes D1 and D2 is enough. The voltage level of switch control signal SWC, i.e. the gate voltage of transistor MN2, is accordingly almost at a range from zero Volts to a voltage smaller than a threshold voltage Vt (i.e. below 0.7 Volts). The transistor MN2 is still kept at the off state or turned off. Almost no currents pass through the conductive unit 1101. In this situation, the clamp transistor 120 is still kept at the off state or turned off. The protection apparatus 100 in this situation is not arranged to discharge abnormal energy from the signal VDD to the ground level.

When/if the voltage at signal VDD instantaneously and significantly rises and becomes higher than 2.1 Volts (i.e. becomes higher than three times of the threshold voltage Vt), the voltage detection circuit 105 decides that an over voltage event occurs in the signal VDD. In this situation, the transistor MN1 is turned on, and the diodes D1 and D2 are forward. In addition, the voltage level of switch control signal SWC generated by the voltage detection circuit 105 becomes higher than the threshold voltage such as 0.7 Volts. The transistor MN2 is turned on. In this situation, a divided voltage is generated at the drain of transistor MN2 and form example is designed to be almost equal to zero volts, e.g. 0.5 Volts. That is, the voltage level of voltage control signal SVC is lower than a threshold voltage. Thus, the transistor NM3 is off, and the transistor MP2 is turned on. The voltage at the output of the inverter circuit 115 is at the high logic level (e.g. the output is almost equal to 2.1 Volts or higher voltage). The clamp transistor 120 is turned on. The protection apparatus 100 in this situation is triggered to discharge abnormal energy from the signal VDD to the ground level.

Actually, it should be noted that the clamp transistor 120 in this embodiment is turned on and can be regarded as a resistor with almost zero resistance in an early conductance stage since the voltage at the output of the inverter circuit 115 is raised up to almost 2.1 Volts or a higher voltage due to the abnormal energy or over voltage event. Compared to a conventional scheme, the performance of apparatus 100 is significantly improved.

Further, it should be noted that in other embodiments the switch unit 1102 may be implemented by using other circuit component (s) and thus the switch control signal SWC may be designed with different voltage levels to turn on/off the circuit component(s) within the switch unit 1102. These modifications also fall within the scope of the invention.

Further, in one embodiment, the number of diodes serially-connected in the voltage detection circuit 105 may be other values such as one, three, or four. This can be configured or set by a user or by a circuit designer. This is not meant to be a limitation of the invention.

Figure 3:
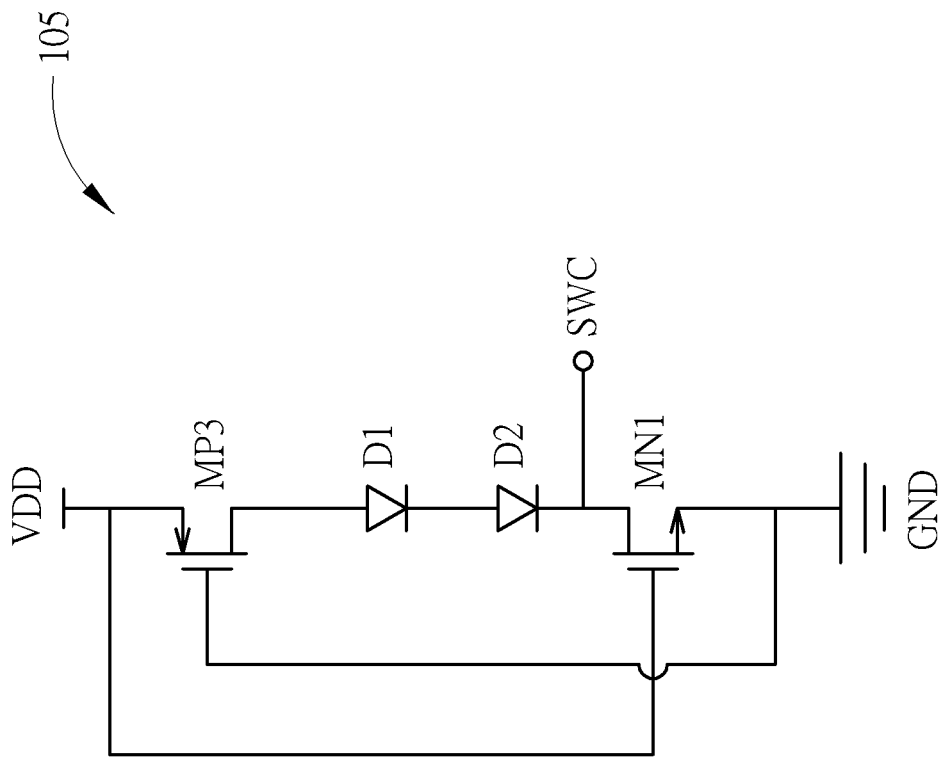
FIG. 3 is a circuit diagram of a first example of the voltage detection circuit of FIG. 1.

Further, in one embodiment, the voltage detection circuit 105 may further comprise another transistor such as a PMOS transistor MP3 which is coupled between the power supply line VDD and the above-mentioned serially connected diodes D1 and D2. FIG. 3 is a circuit diagram of another example of the voltage detection circuit 105. The PMOS transistor MP3 may have a gate coupled to the ground level GND, a source coupled to the power supply line VDD, and a drain coupled to the anode of diode D1 among the serially connected diodes D1 and D2. The PMOS transistor MP3 is at an always-on state since its gate terminal is directly coupled to the ground level GND. Additionally, in other modifications, the number of serially-connected diodes placed between the transistors MN1 and MP3 on FIG. 3 can be different. For example, the number of diode(s) may be equal to one, three, or four. These modifications all fall within the scope of the invention.

Further, in other embodiments, to achieve different implementations of the switch control signal SWC in response to different circuit designs of the switch unit 1102, the switch control signal SWC maybe generated at the anode of diode D2 (i.e. the cathode of diode D1) in FIG. 2 or FIG. 3. That is, the switch control signal SWC may be generated at the anode of a bottom diode among the multiple serially-connected diodes wherein the bottom diode means a diode having the cathode directly coupled to the transistor MN1. In addition, the number of multiple serially-connected diodes can be different in other examples.

Figure 4:
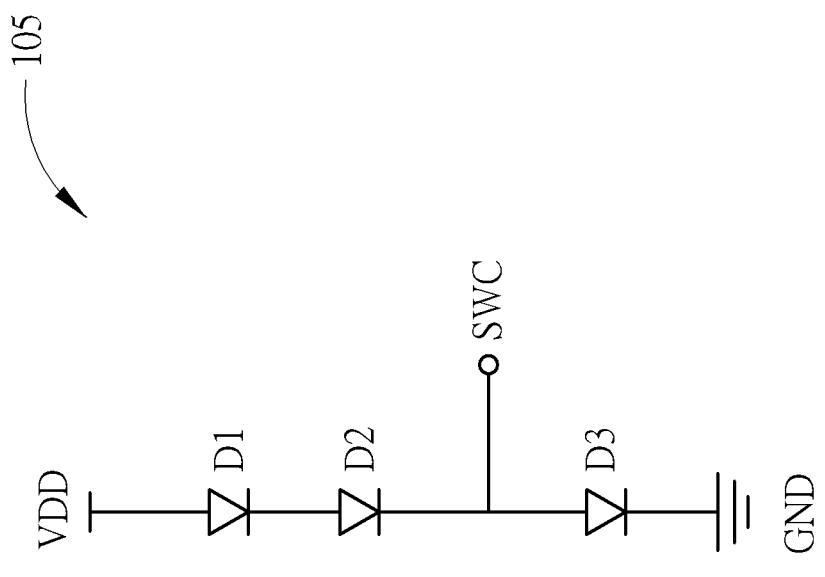
FIG. 4 is a circuit diagram of a second example of the voltage detection circuit of FIG. 1.

Additionally, in other embodiments, the voltage detection circuit 105 may comprise multiple diodes connected in series to generate the switch control signal SWC. FIG. 4 is a circuit diagram of another example of the voltage detection circuit 105 of FIG. 1. The voltage detection circuit 105 is designed to comprise at least one first diode connected in series and at least one second diode connected in series and placed between the first diodes and ground level GND wherein the switch control signal SWC is generate at an intermediate node between the first diodes and second diodes. For example, in FIG. 4, the voltage detection circuit 105 comprises two first diodes (represented by D1 and D2) and a second diode (represented by D3). The switch control signal SWC is generated at the anode of the diode D3, i.e. the cathode of diode D2. When/if the voltage level at the power supply line VDD rises and becomes higher than 2.1 Volts (i.e. three times of the forward biased voltage of a diode), the voltage detection circuit 105 of FIG. 4 can detect that an over voltage event occurs. In this situation, the diodes D1, D2, and D3 are forward biased since the voltage drop is enough. The switch control signal SWC is with a voltage level equal to the voltage drop across the diode D3, e.g. 0.7 Volts, and thus such switch control signal SWC can be arranged to turn on the switch unit 1102 so that the clamp transistor 120 is turned on to discharge the abnormal energy occurring in the power supply line VDD.

Additionally, when/if the voltage level at the power supply line VDD is lower than 2.1 Volts (i.e. three times of the forward biased voltage of a diode), the voltage detection circuit 105 of FIG. 4 is arranged to determine that no over voltage events occur. In this situation, the diodes D1, D2, and D3 are not forward biased since the voltage drop is not enough. According to the characteristic curve of one diode, even though the voltage drop is not enough to forward bias the three diodes, actually a smaller leakage current of diode D3 may exist and the voltage drop across the diode D3 is lower than a P-N junction voltage such as 0.7 Volts. That is, the switch control signal SWC in this situation is with a voltage level smaller than the threshold voltage Vt, and the switch unit 1102 if implemented by using the transistor MN2 of FIG. 2 is not enabled to become closed or conductive. The clamp transistor 120 is not turned on or kept off and is not arranged to discharge the abnormal energy. Thus, when the voltage level at power supply line VDD rises and becomes higher (but not higher than 2.1 Volts) due to system power ON/OFF, the voltage detection circuit 105 of FIG. 4 can correctly determine that no over voltage events occur.

Further, in other embodiments, the number of first diode(s) and the number of second diode(s) can be designed or configured as different values. For example, the number of first diode(s) may be equal to one, three, or four. The number of second diode(s) can be also designed to be different values in response to different circuit designs of the switch unit 1102.

Figure 5:
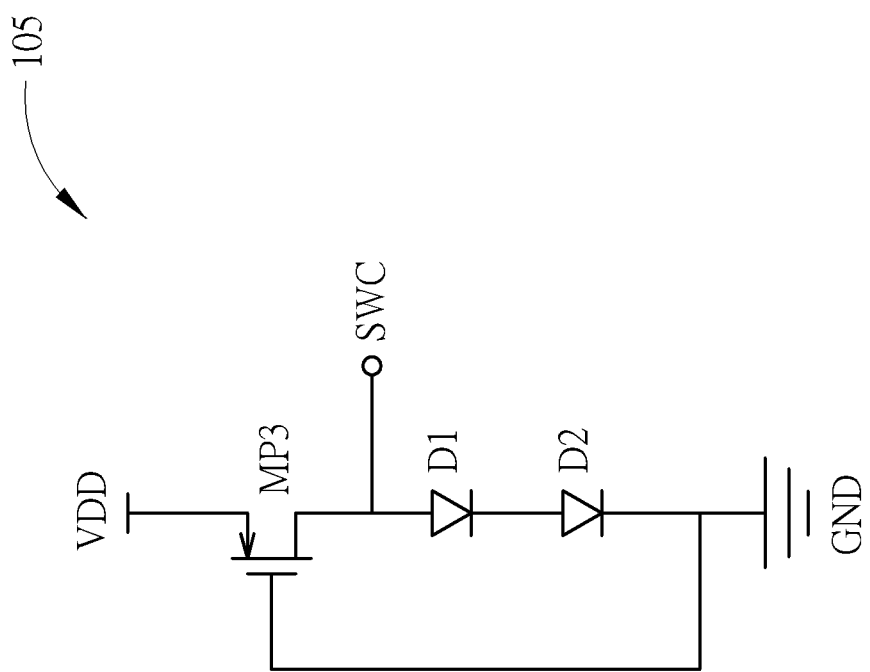
FIG. 5 is a circuit diagram of a third example of the voltage detection circuit of FIG. 1.

Further, in response to different circuit designs of the switch unit 1102 within the controlling circuit 110, FIG. 5 is a circuit diagram of another example of the voltage detection circuit 105 of FIG. 1. The voltage detection circuit 105 comprises a PMOS transistor MP3 and two diodes D1 and D2 connected in series. The PMOS transistor MP3 has a gate coupled to the ground level GND, a source coupled to the power supply line VDD, and a drain coupled to the anode of diode D1. The switch control signal SWC is generated at the anode of diode D1.

When the voltage level at power supply line VDD rises and becomes higher to cause the diodes D1 and D2 forward biased, the voltage detection circuit 105 of FIG. 5 can determine that the level at power supply line VDD is influenced by abnormal energy. The voltage detection circuit 105 is arranged to output the switch control signal SWC with a level almost equal to two times of the P-N junction voltage (e.g. 1.4 Volts) to turn on the switch unit 1102 so as to turn on the clamp transistor 120. Instead, if the voltage level at power supply line VDD is not enough to cause the diodes D1 and D2 forward biased, the voltage detection circuit 105 of FIG. 5 can determine that no over voltage events occur. The voltage detection circuit 105 is arranged to output the switch control signal SWC with a level almost equal to the level of power supply line VDD minus the voltage drop across the drain and source of transistor MP3 to turn off the switch unit 1102 so as to turn off or keep off the clamp transistor 120.

Further, in other embodiments, the voltage detection circuit 105 of FIG. 5 may further comprise at least one specific diode(s) configured or placed between the diode D1 and the transistor MP3 wherein the at least one specific diode(s) and the diodes D1 and D2 are connected in series. The switch control signal SWC is generated at the anode of diode D1.

Further, in other embodiments, in response to different circuit designs of switch unit 1102, the switch control signal SWC may be a signal generated at an intermediate node between diodes D1 and D2, i.e. the anode of diode D2 in FIG. 5. The modifications also fall within the scope of the invention.

Figure 6:
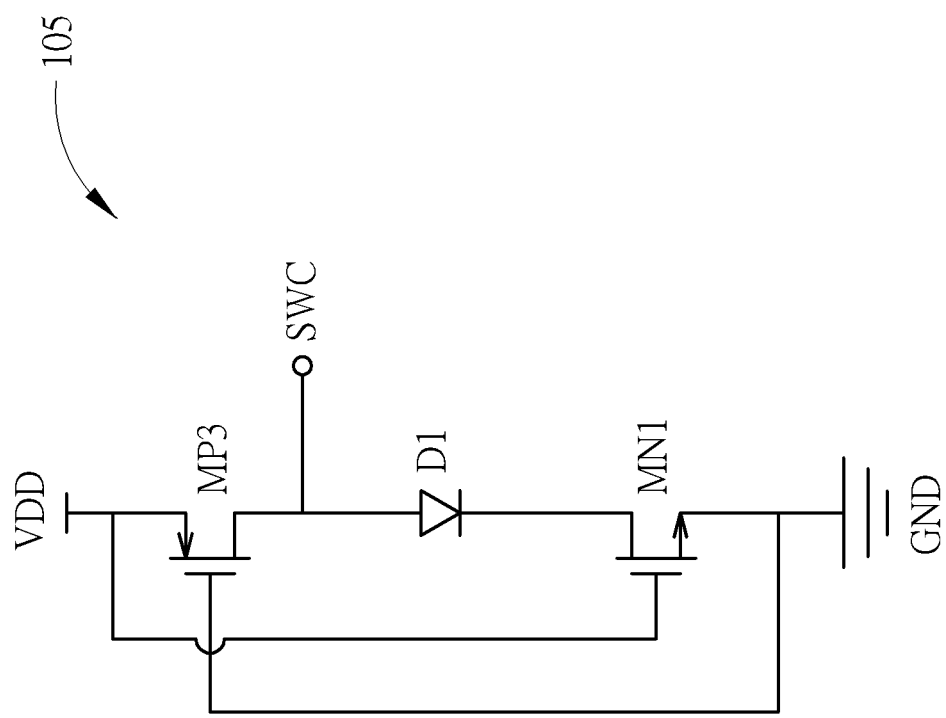
FIG. 6 is a circuit diagram of a fourth example of the voltage detection circuit of FIG. 1.

FIG. 6 is a circuit diagram of another example of the voltage detection circuit 105 of FIG. 1. The voltage detection circuit 105 in FIG. 6 comprises a PMOS transistor MP3, a diode D1, and an NMOS transistor MN1. The PMOS transistor MP3 has a gate coupled to the ground level, a source coupled to the power supply line VDD, and a drain coupled to the anode of diode D1. The NMOS transistor MN1 has a gate coupled to the power supply line VDD, a source coupled to the ground level GND, and a drain coupled to the cathode of diode D1. The switch control signal SWC is generated at the anode of diode D1. The transistors MN1 and MP3 are designed to be turned on when the circuit chip is powered on and supplied with a normal power supply voltage. When the voltage level at power supply line VDD rises and becomes higher to cause the diode D1 forward biased, the voltage detection circuit 105 of FIG. 6 can determine that the level at power supply line VDD is influenced by abnormal energy, i.e. the occurrence of an over voltage event. The voltage detection circuit 105 is arranged to output the switch control signal SWC to turn on the switch unit 1102 so as to turn on the clamp transistor 120. Instead, if the voltage level at power supply line VDD is not enough to cause the diode D1 forward biased, the voltage detection circuit 105 of FIG. 6 can determine that no over voltage events occur. The voltage detection circuit 105 is arranged to output the switch control signal SWC to turn off the switch unit 1102 so as to turn off or keep off the clamp transistor 120.

Further, in other embodiments, the voltage detection circuit 105 of FIG. 6 may further comprise at least one specific diode(s) configured or placed between the diode D1 and the transistor MP3 wherein the at least one specific diode(s) and the diode D1 connected in series. The switch control signal SWC is generated at the anode of diode D1. This modification also falls within the scope of the invention.

Additionally, the conductive unit 1101 of controlling circuit 110 may be implemented by using other circuit component(s). For example, the conductive unit 1101 may comprises a resistor having a first end coupled to the power supply line VDD and a second end coupled to the drain of transistor MN2 of FIG. 2. Alternatively, in other embodiment, the conductive unit 1101 in FIG. 2 may comprises the PMOS transistor MP1 and a resistor which has a first end coupled to the drain of PMOS transistor MP1 and a second end coupled to the drain of transistor MN2. These modifications also obey the spirits of the invention.

Further, to avoid the influence of parasitic capacitor (s), the inverter circuit 115 of FIG. 2 in other embodiments may further comprise another PMOS transistor placed between power supply line VDD and PMOS transistor MP2 and/or further comprise another NMOS transistor placed between ground level GND and NMOS transistor MN3. Such another PMOS transistor has a gate coupled to the ground level GND, a source coupled to the power supply line VDD, and a drain coupled to the source of PMOS transistor MP2. Such another NMOS transistor has a gate coupled to the power supply line VDD, a source coupled to the ground level GND, and a drain coupled to the source of NMOS transistor MN3.

Figure 7:
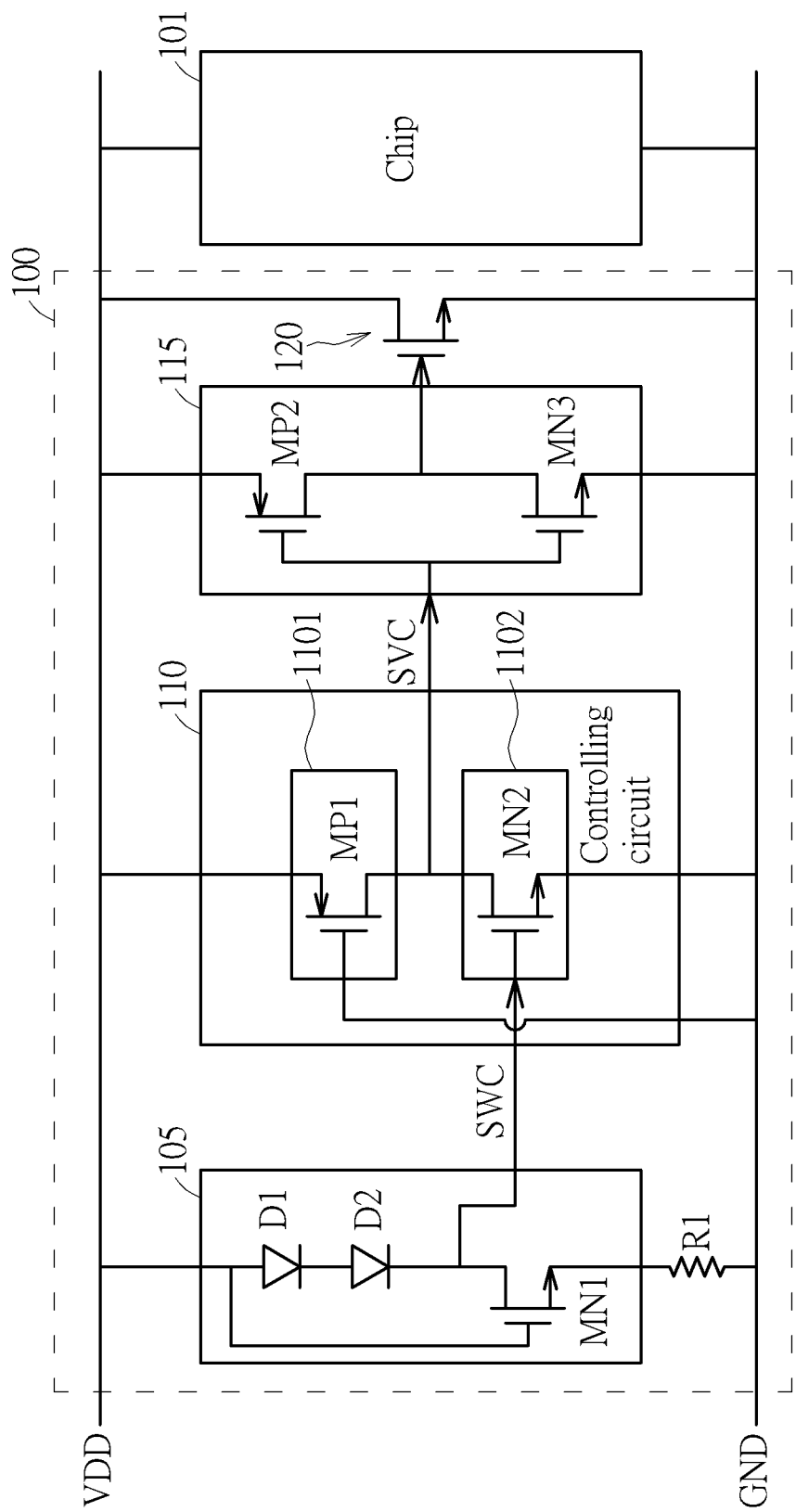
FIG. 7 is a circuit diagram of the over voltage/energy protection apparatus as shown in FIG. 1 according to another embodiment of the invention.

Further, in another embodiment, a resistor circuit R1 may be disposed between the source of transistor MN1 as shown in FIG. 2 and the ground level GND. FIG. 7 shows a diagram of a modification based on such resistor circuit.

Figure 8:
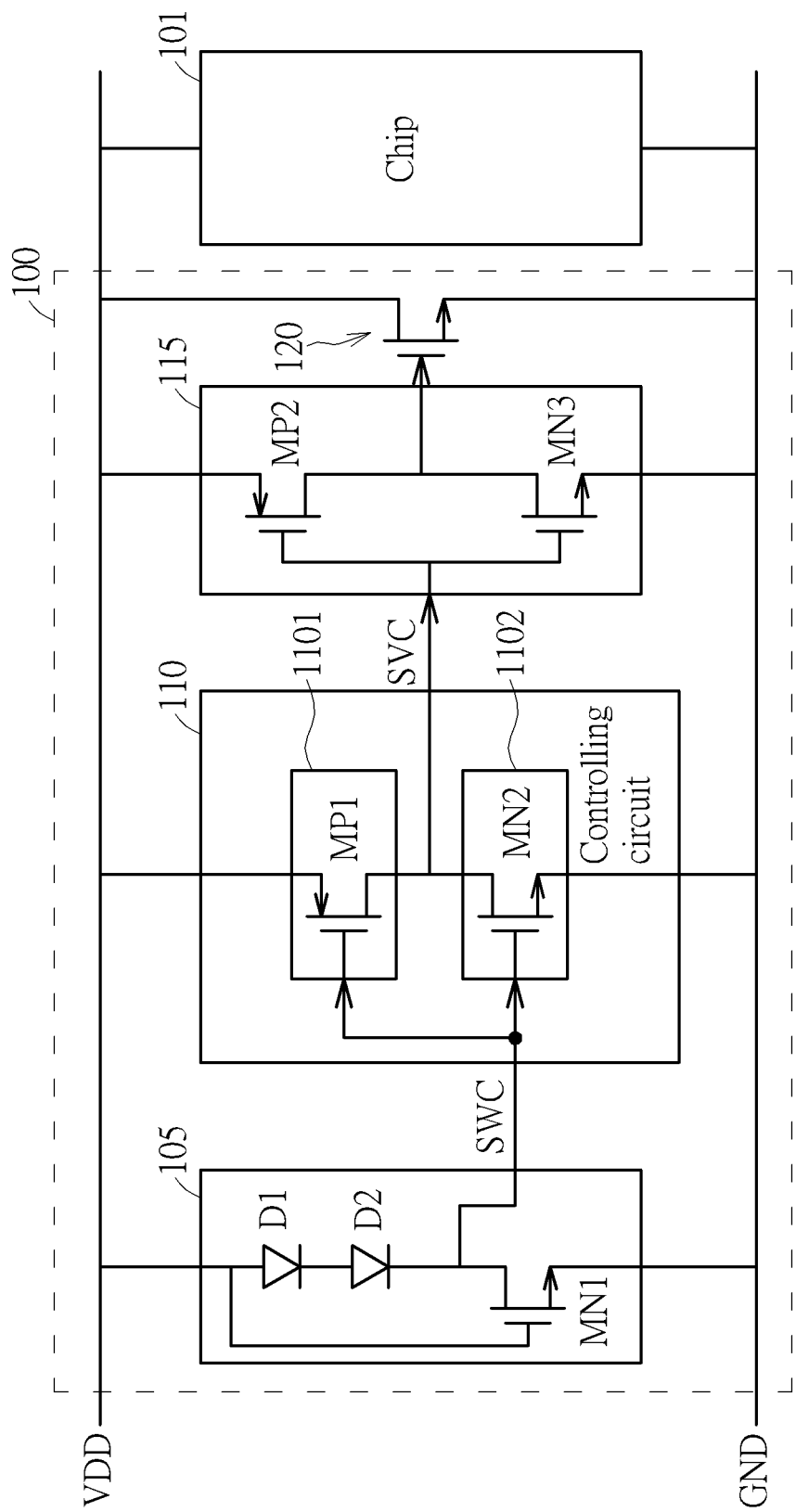
FIG. 8 is a circuit diagram of the over voltage/energy protection apparatus as shown in FIG. 1 according to another embodiment of the invention.
Figure 9:
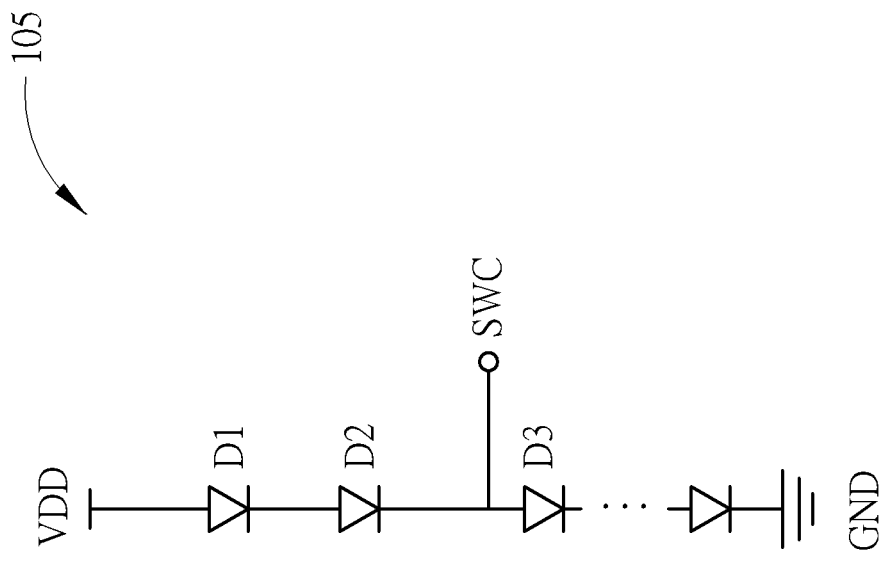
FIG. 9 is a diagram showing the voltage detection circuit shown on FIG. 4 comprising multiple diodes D3 connected in series according to an embodiment of the invention.
Figure 10:
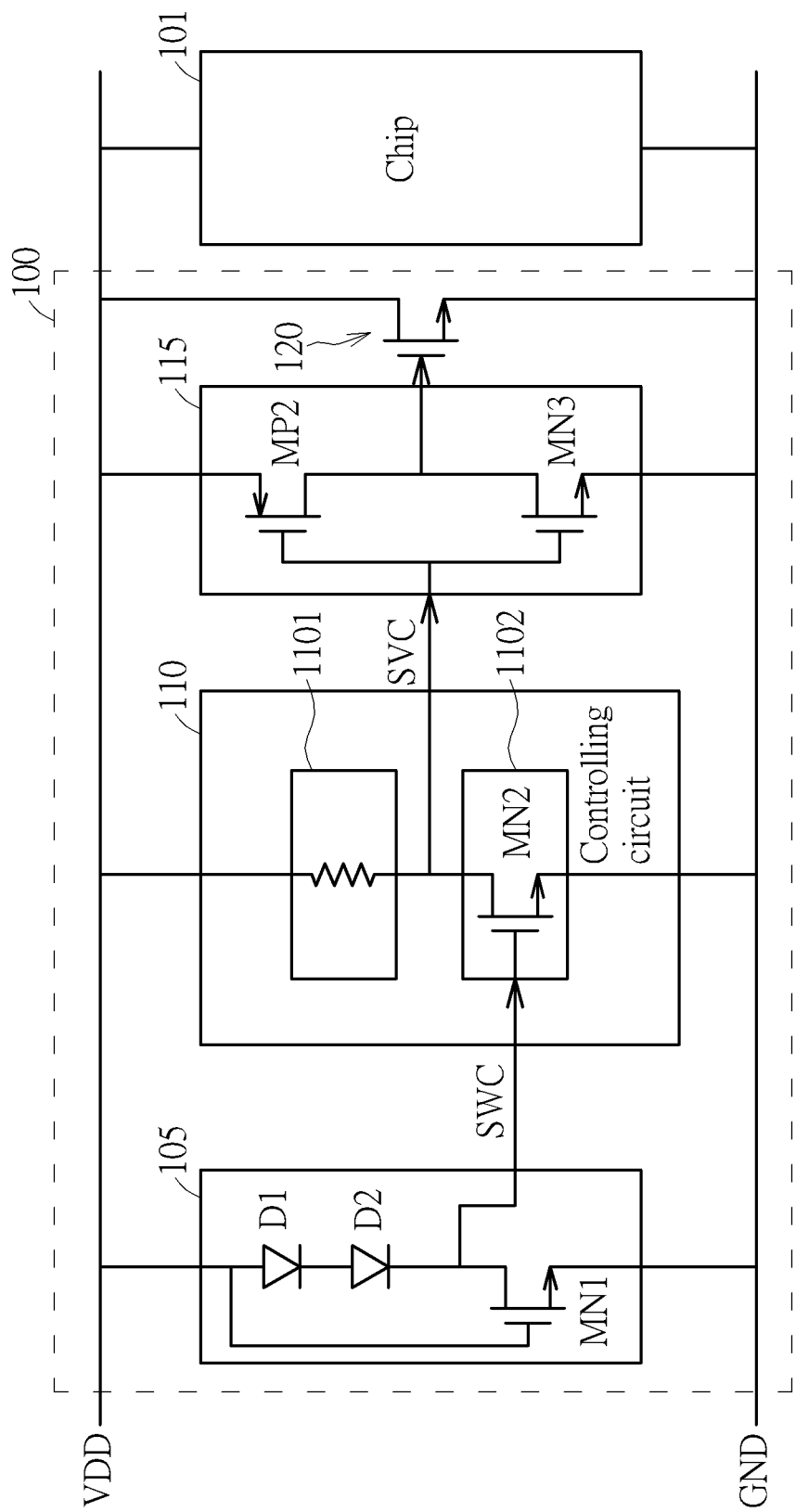
FIG. 10 is a diagram showing the conductive unit of FIG. 2 comprising a resistor having a first end coupled to the power supply line VDD and a second end coupled to the drain of the transistor MN2 according to an embodiment of the invention.
Figure 11:
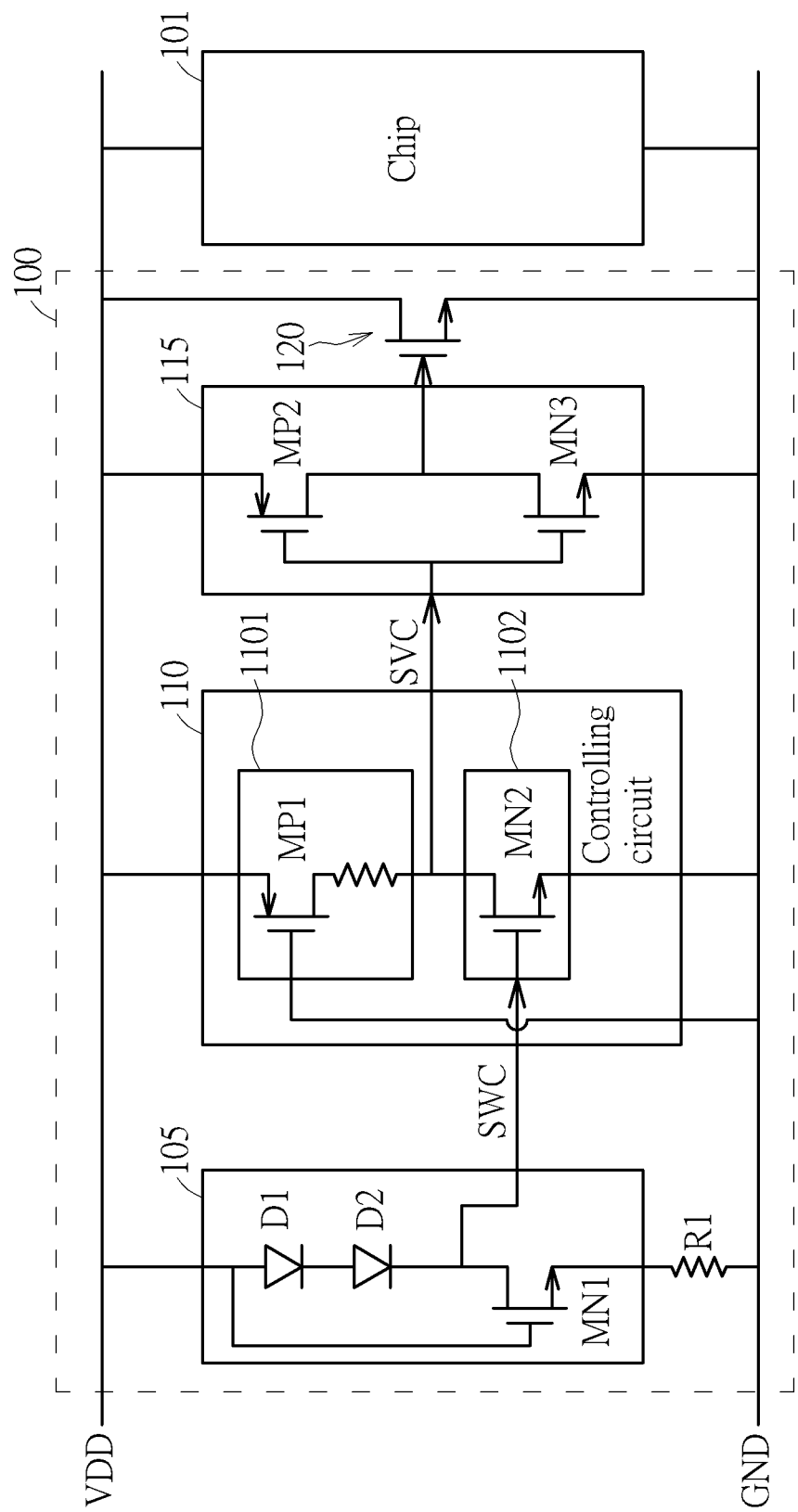
FIG. 11 is a diagram showing that the conductive unit comprises the PMOS transistor MP1 and a resistor which has a first end coupled to the drain of PMOS transistor MP1 and a second end coupled to the drain of transistor MN2 according to an embodiment of the invention.

Further, in other embodiments, the gate of transistor MP1 shown on FIG. 2 may be configured to be connected to the switch control signal SWC. That is, both the gate terminals of transistors MP1 and MN2 are connected to the switch control signal SWC, e.g. the signal at the drain of transistor MN1 in FIG. 2. FIG. 8 shows a diagram of a modification based on such circuit design.

Compared to the conventional RC time constant-based ESD scheme, the EOS/ESD apparatus/solution provided by the above embodiments can effectively and correctly determine that an over voltage event's occurrence is exactly caused due to abnormal energy rather than system power ON/OFF. For example, a level at the power supply line VDD may rise to 1.8 Volts from a normal supply voltage such as 1 Volts due to the system power ON/OFF, and the provided EOS/ESD apparatus does not turn on the clamp transistor. The normal voltage level at power supply line VDD in this situation is not discharged and almost no current leakages occur. In addition, when the level at the power supply line VDD rises to 2.1 Volts or 3 Volts due to abnormal energy, the provided EOS/ESD apparatus can immediately turn on the clamp transistor to discharge the abnormal energy. In the early stage of conductance of clamp transistor, the clamp transistor in the above embodiments can be regarded as a resistor with almost zero impedance. That is, the performance of the clamp transistor in the above embodiments is significantly enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An over voltage/energy protection apparatus, comprising:
   a voltage detection circuit, configured to detect whether an over voltage event occurs in a power supply line to generate a switch control signal;
   a controlling circuit having a switch unit coupled to the voltage detection circuit, the switch unit being turned on/off to generate a voltage control signal according to the switch control signal;
   an inverter circuit having an output and an input coupled to the voltage control signal transmitted from the controlling circuit; and
   a clamp transistor having a control terminal coupled to the output of the inverter, configured to be turned on when the over voltage event occurs in the power supply line;
   wherein the voltage detection circuit comprises:
      a plurality of first diodes connected in series, the plurality of first diodes having an anode coupled to the power supply line and a cathode coupled to a first transistor; and
      the first transistor having a control terminal coupled to the power supply line, a first terminal coupled to the cathode of the plurality of first diodes, and a second terminal coupled to a ground level;
      wherein the switch control signal is generated at a cathode of a first diode among the plurality of first diodes connected in series, and the first diode is not a bottom diode, which is directly connected to the first transistor, among the plurality of first diodes connected in series.

2. The apparatus of claim 1, wherein the voltage detection circuit is arranged to generate the switch control signal with a voltage lower than a particular voltage threshold when detecting that no over voltage events occur in the power supply line, and is arranged to generate the switch control signal with another voltage higher than the particular voltage threshold when detecting that the over voltage event occurs in the power supply line.

3. The apparatus of claim 2, wherein the particular voltage threshold is a threshold voltage of a transistor.

4. The apparatus of claim 1, wherein the voltage detection circuit further comprises:
   a PMOS transistor having a control terminal coupled to the ground level, a first terminal coupled to the power supply line, and a second terminal coupled to the anode of the at least one diode, the PMOS transistor being coupled between the power supply line and the at least one diode.

5. An over voltage/energy protection apparatus, comprising:
   a voltage detection circuit, configured to detect whether an over voltage event occurs in a power supply line to generate a switch control signal;
   a controlling circuit having a switch unit coupled to the voltage detection circuit, the switch unit being turned on/off to generate a voltage control signal according to the switch control signal;
   an inverter circuit having an output and an input coupled to the voltage control signal transmitted from the controlling circuit; and
   a clamp transistor having a control terminal coupled to the output of the inverter, configured to be turned on when the over voltage event occurs in the power supply line;
   wherein the voltage detection circuit comprises:
      at least one first diode having an anode coupled to the power supply line; and
      at least one second diode having an anode coupled to a cathode of the at least one first diode, and a cathode coupled to a ground level;
      wherein the switch control signal is generated at the anode of the at least one second diode; and, the at least one second diode comprises a plurality of second diodes connected in series, and the switch control signal is generated at an intermediate node between the at least one first diode and the plurality of second diodes to a control terminal of the switch unit so as to determine whether to turn on/off the switch unit.

6. The apparatus of claim 5, wherein the at least one first diode comprises a plurality of first diodes connected in series.

7. The apparatus of claim 5, wherein the voltage detection circuit further comprises:
   a PMOS transistor having a control terminal coupled to the ground level, a first terminal coupled to the power supply line, and a second terminal coupled to the anode of the at least one first diode, the PMOS transistor being coupled between the power supply line and the at least one first diode.

8. The apparatus of claim 1, wherein the controlling circuit comprises: a conductive unit having a first terminal coupled to the power supply line and a second terminal; wherein the switch unit is a second transistor having a control terminal coupled to the switch control signal, a first terminal coupled to the second terminal of the conductive circuit unit, and a second terminal coupled to a ground level; the switch control signal is arranged to turn on/off the second transistor to generate the voltage control signal at the first terminal of the second transistor, and, the conductive unit comprises a PMOS transistor having a gate coupled to the ground level, a source coupled to the power supply line, and a drain coupled to the first terminal of the second transistor.

9. The apparatus of claim 8, wherein the conductive unit comprises a PMOS transistor having a gate coupled to the switch control signal, a source coupled to the power supply line, and a drain coupled to the first terminal of the second transistor.

10. The apparatus of claim 8, wherein the conductive unit further comprises a resistor coupled between the drain of the PMOS transistor and the first terminal of the second transistor.

* * * * *